United States Patent
Shih et al.

(10) Patent No.: US 7,889,541 B2
(45) Date of Patent: Feb. 15, 2011

(54) 2T SRAM CELL STRUCTURE

(75) Inventors: Wei-Chiang Shih, Taipei (TW);
Chen-Hao Po, Taipei County (TW);
Kwo-Jen Liu, Taichung (TW)

(73) Assignee: Faraday Technology Corp.,
Science-Based Industrial Park, Hsin-Chu
(TW)

( * ) Notice: Subject to any disclaimer, the term of this patent is extended or adjusted under 35 U.S.C. 154(b) by 90 days.

(21) Appl. No.: 12/422,078

(22) Filed: Apr. 10, 2009

(65) Prior Publication Data
US 2009/0257273 A1    Oct. 15, 2009

(30) Foreign Application Priority Data
Apr. 15, 2008    (TW) .............................. 97113646 A

(51) Int. Cl.
*G11C 11/00* (2006.01)

(52) U.S. Cl. ................ 365/154; 365/222; 365/196; 365/207; 365/230.06; 365/233.1

(58) Field of Classification Search .................. 365/154, 365/222, 196, 207, 230.06, 233.1
See application file for complete search history.

(56) References Cited

U.S. PATENT DOCUMENTS

| 5,694,355 A | 12/1997 | Skjaveland et al. |
| 2005/0169054 A1* | 8/2005 | Forbes .................... 365/185.08 |
| 2005/0226079 A1 | 10/2005 | Zhu et al. |

FOREIGN PATENT DOCUMENTS

GB    1502334    3/1978

* cited by examiner

*Primary Examiner*—Thong Q Le
(74) *Attorney, Agent, or Firm*—Winston Hsu; Scott Margo

(57) ABSTRACT

A SRAM cell structure includes a first N type switch, a second N type switch, a first storage node, and a second storage node. The first N type switch has a control terminal connected to a word line and a first terminal connected to a bit line. The second N type switch has a control terminal connected to the word line and a first terminal connected to an inverted bit line. The first storage node has a first terminal connected to a second terminal of the first N type switch. The second storage node has a first terminal connected to a second terminal of the second N type switch.

19 Claims, 6 Drawing Sheets

2T SRAM CELL STRUCTURE

FIELD OF THE INVENTION

The present invention relates to a static random access memory, and more particularly to a memory cell structure of a two-transistor static random access memory (2T SRAM).

BACKGROUND OF THE INVENTION

Generally, a random access memory can be classified into a static random access memory (SRAM) and a dynamic random access memory (DRAM). When a SRAM is powered, the data stored in the SRAM will not be lost. Unlike the SRAM, the data stored in the DRAM needs to be periodically refreshed, otherwise the data will be lost. Since the SRAM has a symmetrical configuration, the data accessing speed of each SRAM cell is faster than that of each DRAM cell at the same operating frequency. Although SRAM is more costly than DRAM, the cache memory of the personal computer is usually implemented by SRAM. A conventional SRAM cell consists of six transistors. Such SRAM cell is also referred as a six-transistor static random access memory (6T SRAM).

Referring to FIG. 1, a schematic circuit diagram of a conventional 6T SRAM cell is illustrated. The 6T SRAM cell comprises a flip-flop and two access transistors. The flip-flop includes a pair of cross-coupling inverters. The first inverter includes a first transistor Q1 and a third transistor Q3. The source electrode of the third transistor Q3 is connected to a power source voltage Vcc. The drain electrode of the third transistor Q3 is connected to the output terminal of the first inverter. The gate electrode of the third transistor Q3 is connected to the input terminal of the first inverter. The source electrode of the first transistor Q1 is connected to a ground terminal. The drain electrode of the first transistor Q1 is connected to the output terminal of the first inverter. The gate electrode of the first transistor Q1 is connected to the input terminal of the first inverter. The second inverter includes a second transistor Q2 and a fourth transistor Q4. The source electrode of the fourth transistor Q4 is connected to the power source voltage Vcc. The drain electrode of the fourth transistor Q4 is connected to the output terminal of the second inverter. The gate electrode of the fourth transistor Q4 is connected to the input terminal of the second inverter. The source electrode of the second transistor Q2 is connected to the ground terminal. The drain electrode of the second transistor Q2 is connected to the output terminal of the second inverter. The gate electrode of the second transistor Q2 is connected to the input terminal of the second inverter. The input terminal of the first inverter is connected with the output terminal of the second inverter. The input terminal of the second inverter is connected with the output terminal of the first inverter.

The first access transistor Q5 is interconnected between the output terminal of the first inverter and a bit line BL. The second access transistor Q6 is interconnected between the output terminal of the second inverter and an inverted bit line (/BL). The gate electrodes of the first access transistor Q5 and the second access transistor Q6 are connected to the word line WL. According to the voltage level of the word line signal, the first access transistor Q5 and the second access transistor Q6 are selectively turned on or turned off. That is, the first access transistor Q5 and the second access transistor Q6 are switch elements controllable by the word line signal. The first access transistor Q5 and the second access transistor Q6 are also referred as the pass-gate transistors.

Furthermore, the bit line BL and the inverted bit line (/BL) are both connected to a sense amplifier (not shown). When the first access transistor Q5 and the second access transistor Q6 are turned on in response to the word line signal, the signals of the bit line BL and the inverted bit line (/BL) are outputted from the SRAM through the sense amplifier (not shown).

FIG. 2 is a schematic circuit block diagram of a conventional SRAM. As shown in FIG. 2, the SRAM 100 comprises a main control circuit 10, a column decoder 20, a row decoder 30, a memory cell array 40, and a sense amplifier and input/output control circuit 50. The main control circuit 10 can receive multiple address signals ADD, a clock signal CLK and a read/write signal R/W. The address signals ADD include column address signals and row address signals. The column address signals are transmitted to the column decoder 20 for controlling the bit lines. The row address signals are transmitted to the row decoder 30 for controlling the word lines. The sense amplifier and input/output control circuit 50 is connected to the bit lines. For writing data into the SRAM 100, the input data signals are written into specified memory cells through the sense amplifier and input/output control circuit 50. For reading from the SRAM 100, the data stored in specified memory cells are outputted as the output data signals through the sense amplifier and input/output control circuit 50.

As known, the 6T SRAM cell occupies a large layout area. For increasing the area utilization, the number of transistors contained in the SRAM cell needs to be reduced. Recently, 1T SRAM cell and 2T SRAM cell have been disclosed. Since the 6T SRAM cell has a latch, it is not necessary to refresh the 6T SRAM cell. Due to a leakage current, the data stored in the 1T or 2T SRAM cell are possibly lost. For preventing from data loss, the SRAM 100 has an additional hidden refresh unit and the timing of performing the data refresh operation is properly decided. As such, the user does not need an external data refreshing circuit to perform the data refresh operation of the SRAM.

FIG. 3 is a schematic circuit block diagram of another conventional SRAM. As shown in FIG. 3, the SRAM 100 comprises a main control circuit 10, a column decoder 20, a row decoder 30, a memory cell array 40, a sense amplifier and input/output control circuit 50, and a hidden refresh unit 60. The hidden refresh unit 60 is connected to the main control circuit 10 and the row decoder 30. In comparison with FIG. 2, the main control circuit 10 of the SRAM 100 of FIG. 3 generates address signals to the row decoder 30 during the idle accessing cycle according to the action of the hidden refresh unit 60, thereby refreshing the memory cell array 40. The memory cells of the memory cell array 40 are 1T or 2T SRAM cells. Furthermore, if no clock signal CLK is received by the main control circuit 10, the main control circuit 10 can refresh data of the memory cell array 40 according to the clock signal and the address signals that are generated by the hidden refresh unit 60 and transmitted to the row decoder 30. In other words, by means of the hidden refresh unit 60, the layout area of the SRAM is reduced.

For example, MOSYS Corporation has proposed a 1T SRAM cell. The 1T SRAM cell does not posses two bit lines. Since the sense amplifier is based on a single-ended sensing scheme and includes positive and negative charge pumps, a high standby current occurs. Moreover, the 1T SRAM cell needs an additional refresh control mechanism. Importantly, since the 1T SRAM cell is not compatible with the word line and the bit line of the 6T SRAM cell, the 1T SRAM cell fails to replace the 6T SRAM cell to be used in the application-specific integrated circuit (ASIC).

In addition, XMEM Corporation has proposed a 2T SRAM cell. The 2T SRAM cell is consisted of two PMOS transistors. Since the sense amplifier of the 2T SRAM cell also includes positive and negative charge pumps, the standby current is high. That is, the 2T SRAM cell is not feasible to be used in the application-specific integrated circuit (ASIC).

FIG. 4 is a schematic circuit diagram illustrating another conventional SRAM cell. The SRAM cell is disclosed in US Patent Application No. 20050226079, entitled "Method and apparatus for dual port memory devices having hidden refresh and double bandwidth". As shown in FIG. 4, the SRAM cell comprises two switches 201, 202 and a storage node 211. The storage node 211 is consisted of a PMOS transistor. The storage node 211 can be referred as a PMOS capacitor. The gate electrode of the PMOS transistor is connected to an external voltage VCAPEN. The switches 201 and 202 are also PMOS capacitors. The storage node 211 is interconnected between first terminals of these two switches 201 and 202. The second terminal of the switch 201 is connected to a read and refresh bit line (BLRRF). The control terminal of the switch 201 is connected to a read and refresh word line. The second terminal of the switch 202 is connected to a write bit line (BLW). The gate terminal of the switch 202 is connected to a write word line.

Since the SRAM cell comprises two switches 201, 202 and a storage node 211, the SRAM cell is also referred as a 2T1C SRAM cell. The sense amplifier of the 2T1C SRAM cell is also based on a single-ended sensing scheme. In addition, the word line and the bit line of the 2T1C SRAM cell fail to be compatible with the word line and the bit line of other conventional SRAM cell.

SUMMARY OF THE INVENTION

The present invention provides a SRAM cell having the same word line and bit line as the conventional 6T SRAM cell.

In accordance with an aspect of the present invention, there is provided a SRAM cell structure. The SRAM cell structure includes a first N type switch, a second N type switch, a first storage node, and a second storage node. The first N type switch has a control terminal connected to a word line and a first terminal connected to a bit line. The second N type switch has a control terminal connected to the word line and a first terminal connected to an inverted bit line. The first storage node has a first terminal connected to a second terminal of the first N type switch. The second storage node has a first terminal connected to a second terminal of the second N type switch.

In accordance with another aspect of the present invention, there is provided a static random access memory. The static random access memory includes a main control circuit, a column decoder, a row decoder row, a memory cell array, a sense amplifier and input/output control circuit, and a hidden refresh unit. The main control circuit is used for receiving multiple address signals, a clock signal and a read/write signal. The address signals include column address signals and row address signals. The column decoder is connected to the main control circuit, wherein the column address signals are transmitted to the column decoder for controlling a bit line. The row decoder is connected to the main control circuit, wherein the row address signals are transmitted to the row decoder for controlling a word line. The memory cell array is connected to the column decoder and the row decoder. The sense amplifier and input/output control circuit is connected to the memory cell array. The hidden refresh unit is connected to the main control circuit. When the static random access memory is in a normal operation without refresh mode, the hidden refresh unit performs only a normal write/read operation within one clock cycle. When the static random access memory is in a normal operation with refresh mode, the hidden refresh unit performs a write/read operation followed by a refresh operation on the memory cell array within one clock cycle.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
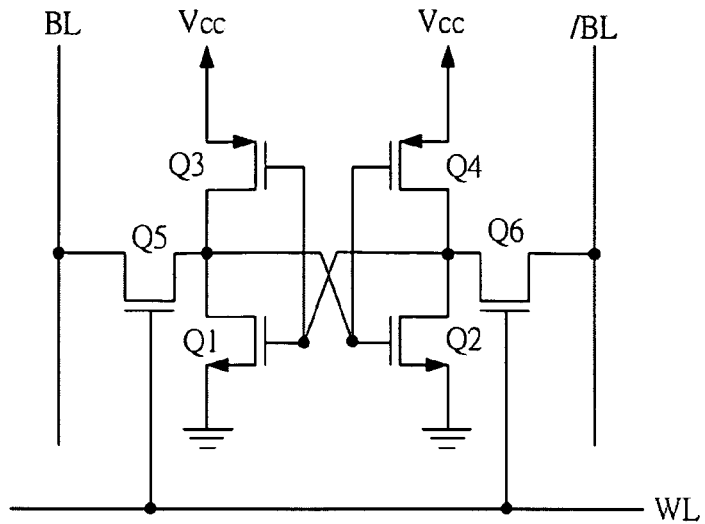
FIG. 1 is a schematic circuit diagram of a conventional SRAM cell.
Figure 2:
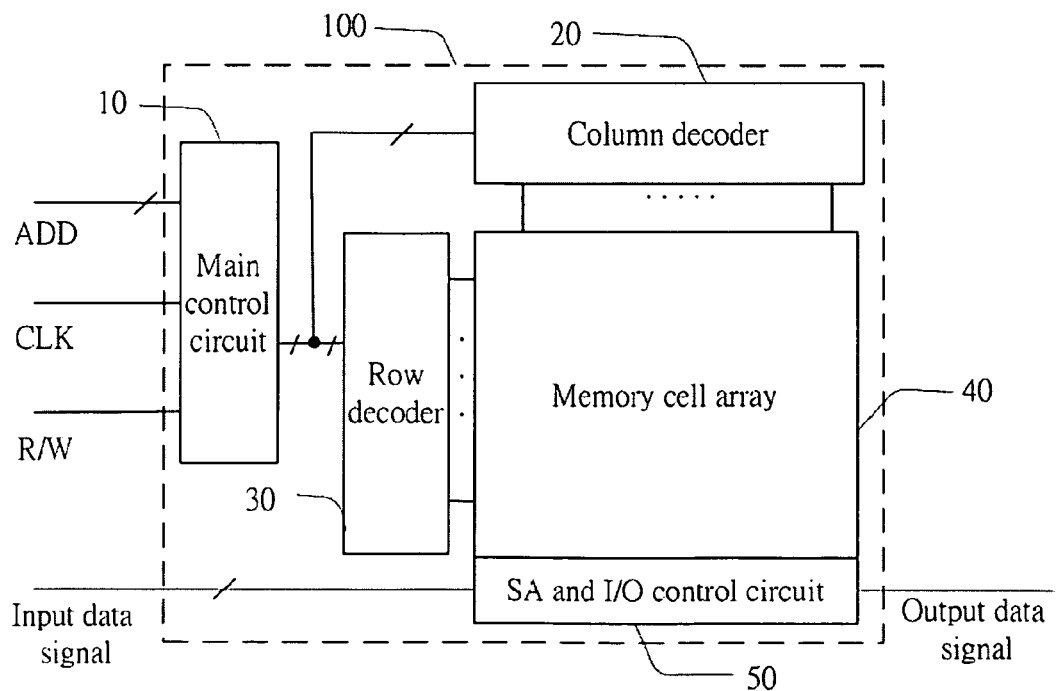
FIG. 2 is a schematic circuit block diagram of a conventional SRAM.
Figure 3:
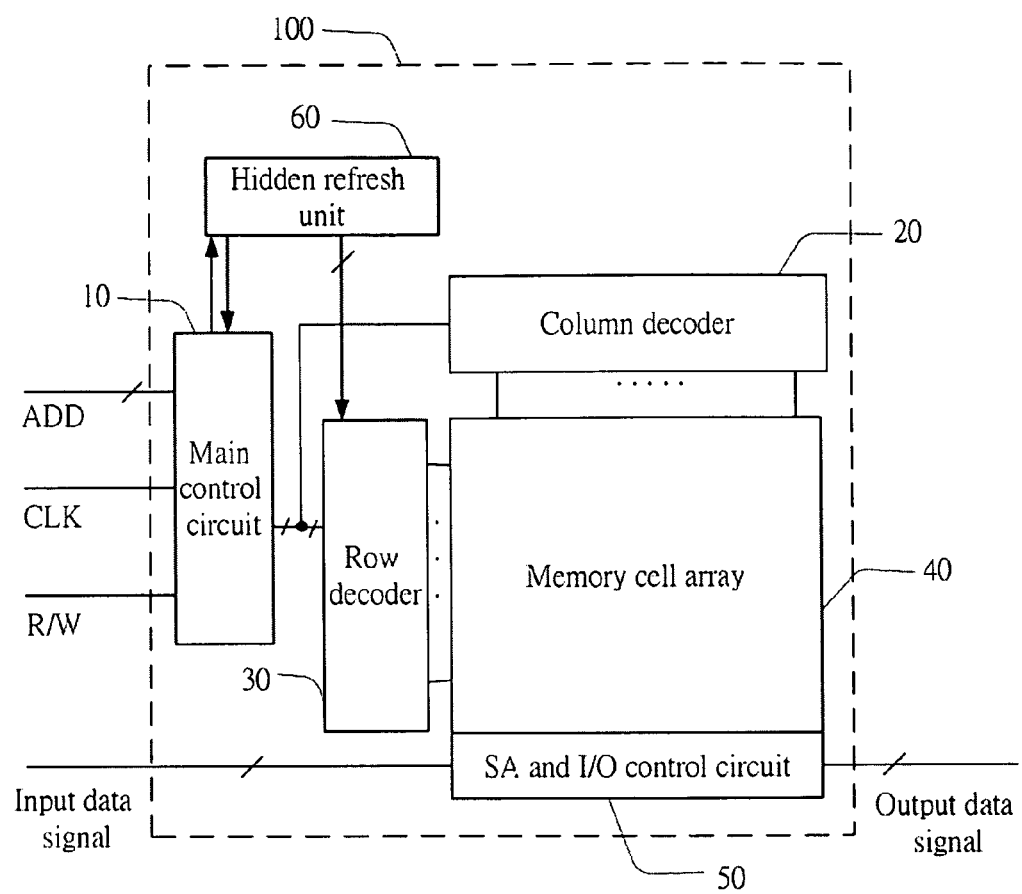
FIG. 3 is a schematic circuit block diagram of another conventional SRAM.
Figure 4:
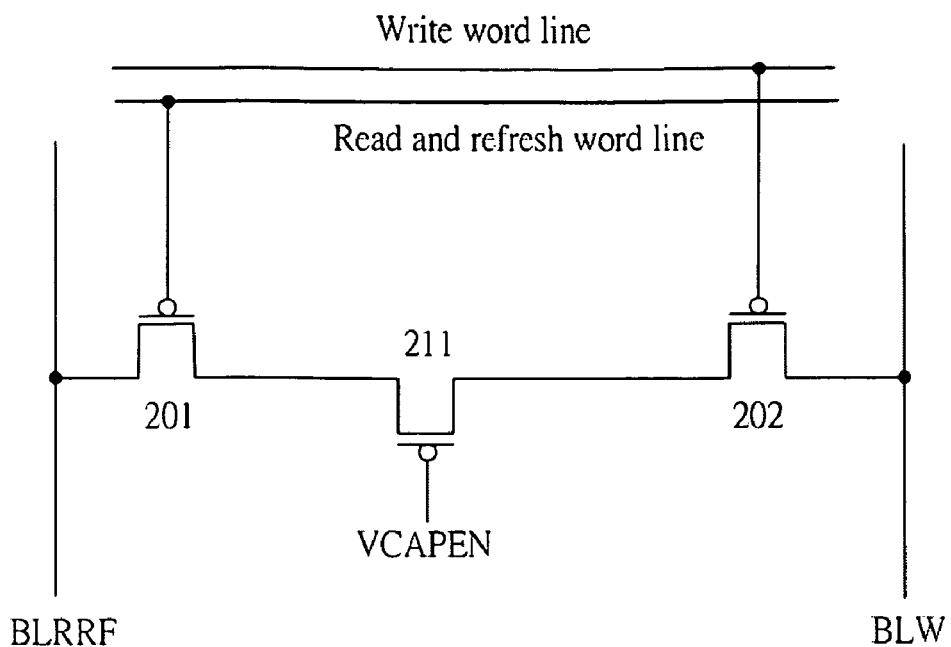
FIG. 4 is a schematic circuit diagram illustrating another conventional SRAM cell disclosed in US Patent Application No. 20050226079.
Figure 5:
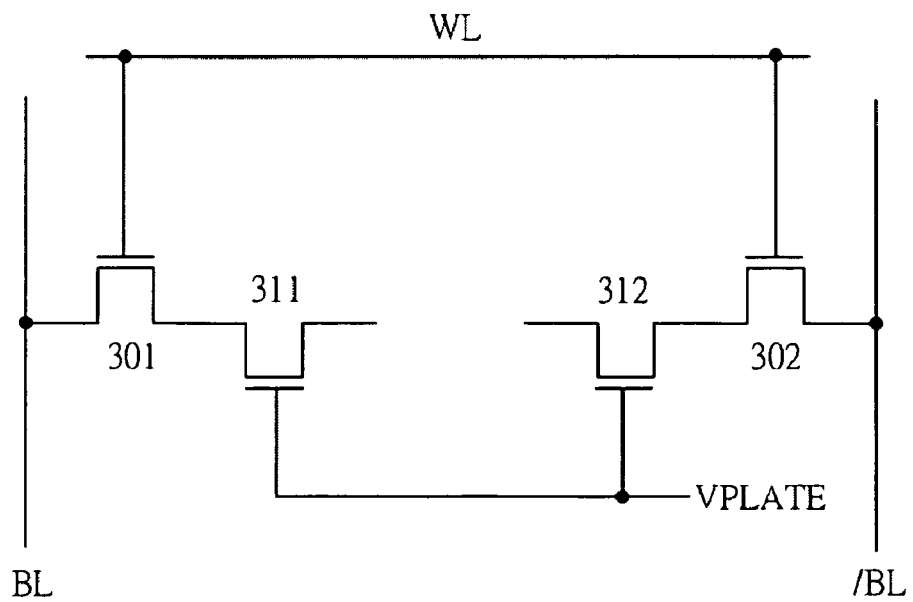
FIG. 5 is a schematic circuit diagram illustrating a SRAM cell according to an embodiment of the present invention.

FIG. 5 is a schematic circuit diagram illustrating a SRAM cell according to an embodiment of the present invention. As shown in FIG. 5, the SRAM cell comprises two switches 301, 302 and two storage nodes 311, 312. The switches 301, 302 and the storage nodes 311, 312 are NMOS transistors. The storage nodes 311 and 312 can be referred as NMOS capacitors. The gate electrode of the NMOS transistors 311 and 312 are connected to an external voltage VPLATE.

A first terminal of the storage node 311 is connected to a first terminal of the switch 301. A second terminal of the storage node 311 is a floating terminal. A second terminal of the switch 301 is connected to a bit line BL. The control terminal (gate electrode) of the switch 301 is connected to a word line WL. A first terminal of the storage node 312 is connected to a first terminal of the switch 302. A second terminal of the storage node 312 is also a floating terminal. A second terminal of the switch 302 is connected to an inverted bit line (/BL). The control terminal (gate electrode) of the switch 302 is connected to the word line WL.

When the external voltage VPLATE is applied to the storage nodes 311 and 312 and the word line WL is enabled, the switches 301 and 302 are turned on. As a result, the storage nodes 311 and 312 will provide complementary data to the bit line BL and the inverted bit line (/BL).

Figure 6:
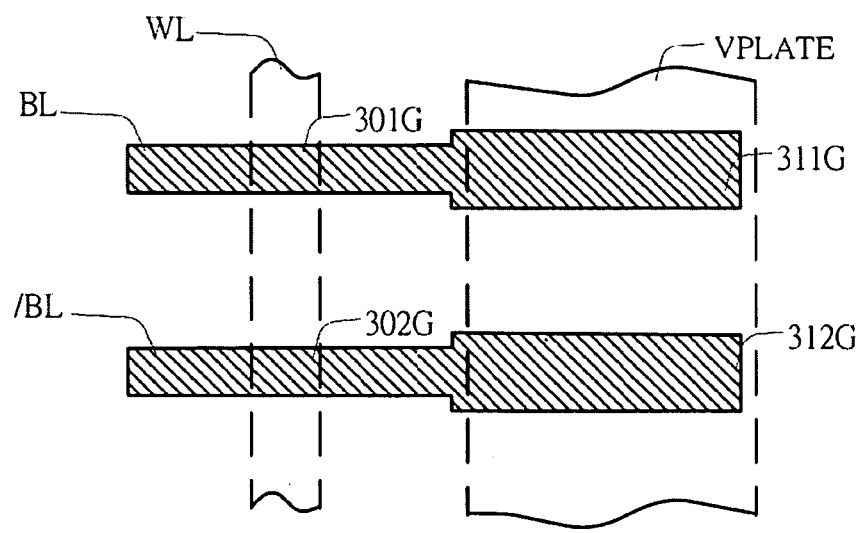
FIG. 6 is a schematic top view illustrating a circuitry layout of the SRAM cell of the present invention.

FIG. 6 is a schematic top view illustrating a circuitry layout of the SRAM cell of the present invention. The two shaded regions are N+ diffusion regions. These N+ diffusion regions have respective first ends connected to the bit line BL and the inverted bit line (/BL). The overlapped regions between the word line WL and the two N+ diffusion regions include the gate electrode 301G of the switch 301 and the gate electrode 302G of the switch 392. The overlapped regions between the external voltage VPLATE and the two N+ diffusion regions include the gate electrode 311G of the storage node 311 and the gate electrode 312G of the storage node 312.

Figure 7:
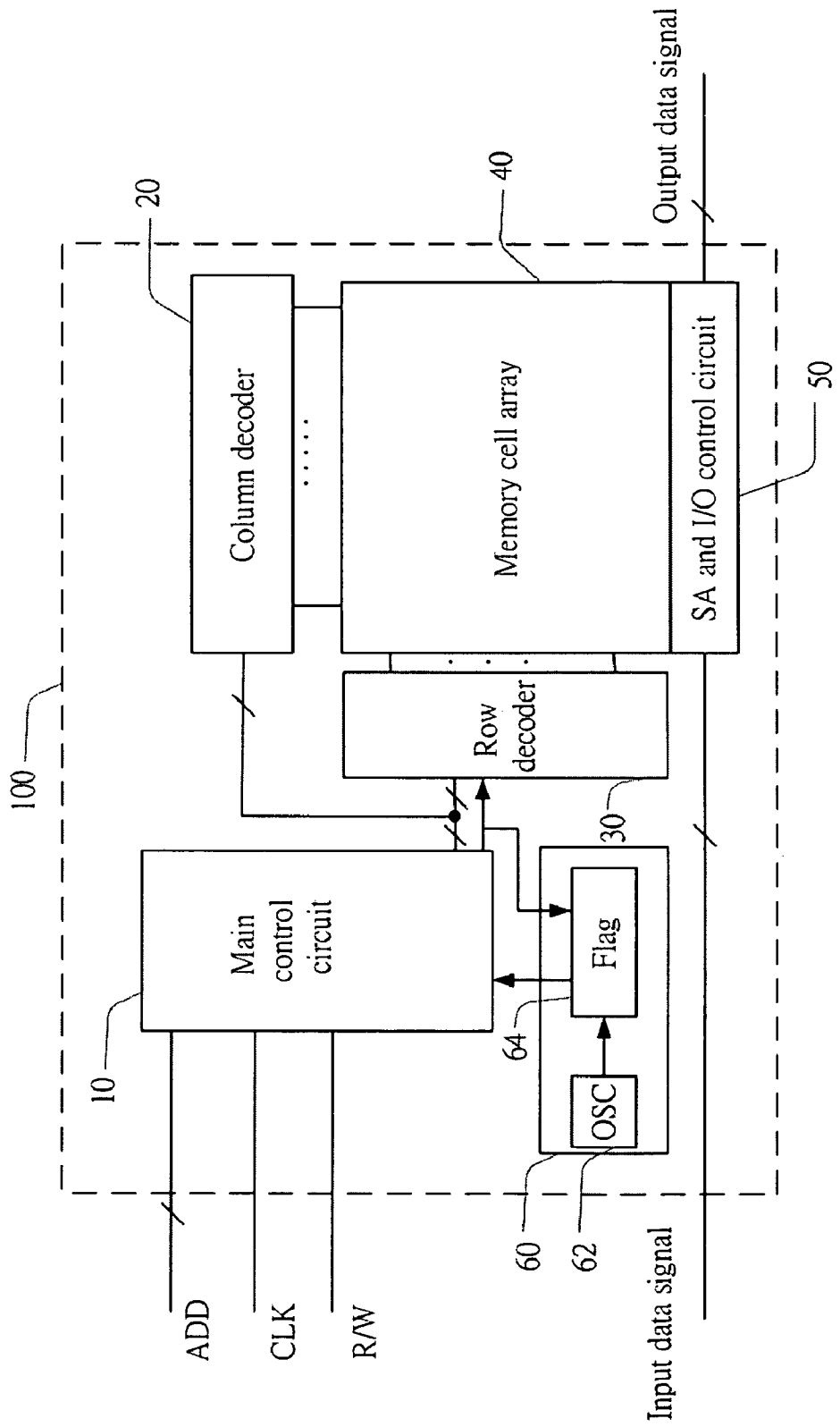
FIG. 7 is a schematic circuit block diagram of a SRAM according to the present invention.

FIG. 7 is a schematic circuit block diagram of a SRAM according to the present invention. As shown in FIG. 7, the SRAM 100 comprises a main control circuit 10, a column decoder 20, a row decoder 30, a memory cell array 40, a sense amplifier and input/output control circuit 50, and a hidden refresh unit 60. The hidden refresh unit 60 is connected to the main control circuit 10 and the row decoder 30.

The hidden refresh unit 60 includes an oscillator 62 and a flag register 64. The oscillator 62 can generate an oscillation clock signal having a lower frequency than the clock signal CLK. In a case that an oscillation clock signal at a high voltage-level state is received by the flag register 64, the flag register 64 is set and thus generates a setting signal to the main control circuit 10. When the setting signal is received by the main control circuit 10, the main control circuit 10 automatically generates a refresh enabling signal and a corresponding refresh address to the row decoder 30, thereby refreshing data of the memory cell array 40. At the same time, the refresh enabling signal is transmitted to the flag register 64 to reset the flag register 64.

Figure 8:
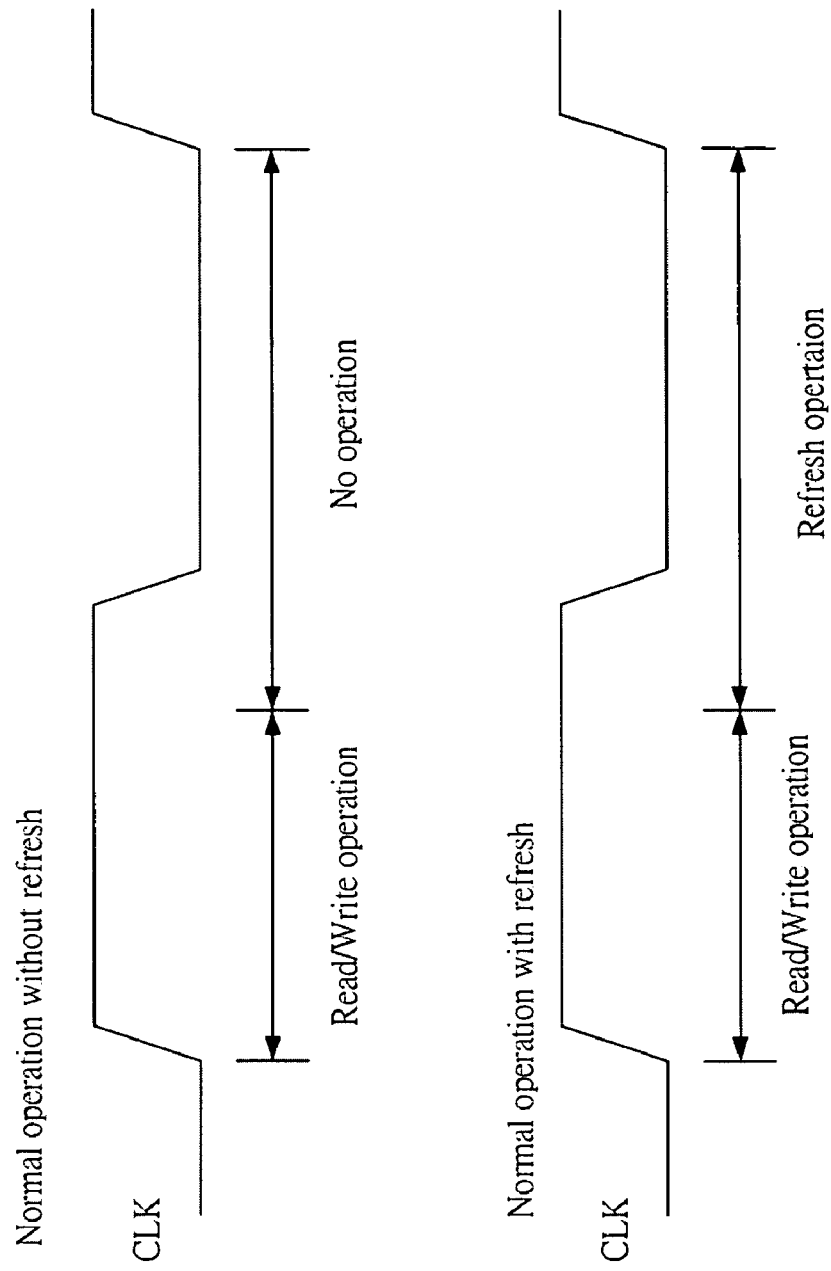
FIG. 8 is a schematic waveform diagram illustrating the timing of executing read, write or refresh operations during the normal operation of the SRAM of the present invention.

FIG. 8 is a schematic waveform diagram illustrating the timing of executing read, write or refresh operations during the normal operation of the SRAM of the present invention. Since the frequency of the clock signal CLK is larger than the oscillation clock signal, the refresh operation may be performed or not during the normal operation of the SRAM. In a case that no refresh operation is performed during the normal operation of the SRAM (i.e. a normal operation without refresh mode), only the write/read operation is done within one clock cycle. Whereas, in a case that the refresh operation can be performed during the normal operation of the SRAM (i.e. a normal operation with refresh mode), the write/read operation is done and the refresh operation following write/read operation is also done within one clock cycle. The hidden refresh unit 60 according to the present invention dose not have to be a clock level/edge trigger circuit (i.e., a trigger circuit triggered by the external clock signal CLK). The write/read and refresh operations are generated (activated/triggered) from internal pulses (e.g., the oscillation clock signal of the internal oscillator 62). Such design can avoid the minimum high/low pulse width constraints.

From the above description, the SRAM cell of the present invention is consisted of N type semiconductor components. The SRAM cell of the present invention can be also referred as a 2T2C SRAM cell. According to the circuitry design, the SRAM cell of the present invention has the same word line and bit line as the conventional 6T SRAM cell. Furthermore, the SRAM cells and a hidden refresh unit constitute the SRAM of the present invention. Since the SRAM cell of the present invention is consisted of two transistors, the layout area is largely reduced. In comparison with the conventional 6T SRAM cell, the layout area of the 2T2C SRAM cell of the present invention is reduced by at least 40%. Moreover, since the SRAM of the present invention has an additional hidden refresh unit and the refresh operation is performed during proper timing, the SRAM of the present invention can prevent from data loss. As such, the user does not need an external data refreshing circuit to perform the refresh operation of the SRAM.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A SRAM cell structure comprising:
a first N type switch having a control terminal connected to a word line and a first terminal connected to a bit line;
a second N type switch having a control terminal connected to the word line and a first terminal connected to an inverted bit line;
a first storage node having a first terminal connected to a second terminal of the first N type switch and a floating second terminal; and
a second storage node having a first terminal connected to a second terminal of the second N type switch and a floating second terminal.

2. The SRAM cell structure according to claim 1 wherein the first N type switch is a first NMOS transistor, which has a gate electrode connected to the word line, a drain electrode connected to the bit line and a source electrode connected to the first terminal of the first storage node.

3. The SRAM cell structure according to claim 1 wherein the second first N type switch is a second NMOS transistor, which has a gate electrode connected to the word line, a drain electrode connected to the inverted bit line and a source electrode connected to the first terminal of the second storage node.

4. The SRAM cell structure according to claim 1 wherein the first storage node is a NMOS capacitor including a third NMOS transistor, and the second storage node is a NMOS capacitor including a fourth NMOS transistor.

5. The SRAM cell structure according to claim 4 wherein the gate electrodes of the third NMOS transistor and the fourth NMOS transistor are connected to an external voltage.

6. The SRAM cell structure according to claim 4 wherein the drain electrode of the third NMOS transistor is connected to the second terminal of the first N type switch, and the drain electrode of the third NMOS transistor is floating.

7. The SRAM cell structure according to claim 4 wherein the drain electrode of the fourth NMOS transistor is connected to the second terminal of the second N type switch, and the drain electrode of the fourth NMOS transistor is floating.

8. The SRAM cell structure according to claim 1 wherein complementary data are stored in the first storage node and the second storage node.

9. A static random access memory comprising:
a main control circuit for receiving multiple address signals, a clock signal and a read/write signal, wherein the address signals includes column address signals and row address signals;
a column decoder connected to the main control circuit, wherein the column address signals are transmitted to the column decoder for controlling a bit line;
a row decoder connected to the main control circuit, wherein the row address signals are transmitted to the row decoder for controlling a word line;
a memory cell array connected to the column decoder and the row decoder;

a sense amplifier and input/output control circuit connected to the memory cell array; and a hidden refresh unit connected to the main control circuit, wherein when the static random access memory is in a normal operation without refresh mode, the hidden refresh unit performs only a normal write/read operation within one clock cycle, and when the static random access memory is in a normal operation with refresh mode, the hidden refresh unit performs a write/read operation followed by a refresh operation on the memory cell array within one clock cycle.

10. The static random access memory according to claim 9 wherein the memory cell array includes multiple memory cells, and each memory cell includes:

a first N type switch having a control terminal connected to a word line and a first terminal connected to a bit line;

a second N type switch having a control terminal connected to the word line and a first terminal connected to an inverted bit line;

a first storage node having a first terminal connected to a second terminal of the first N type switch; and a second storage node having a first terminal connected to a second terminal of the second N type switch.

11. The static random access memory according to claim 10 wherein the first N type switch is a first NMOS transistor, which has a gate electrode connected to the word line, a drain electrode connected to the bit line and a source electrode connected to the first terminal of the first storage node.

12. The static random access memory according to claim 10 wherein the second first N type switch is a second NMOS transistor, which has a gate electrode connected to the word line, a drain electrode connected to the inverted bit line and a source electrode connected to the first terminal of the second storage node.

13. The static random access memory according to claim 10 wherein the first storage node has a floating second terminal, and the second storage node has a floating second terminal.

14. The static random access memory according to claim 10 wherein the first storage node is a NMOS capacitor including a third NMOS transistor, and the second storage node is a NMOS capacitor including a fourth NMOS transistor.

15. The static random access memory according to claim 14 wherein the gate electrodes of the third NMOS transistor and the fourth NMOS transistor are connected to an external voltage.

16. The static random access memory according to claim 14 wherein the drain electrode of the third NMOS transistor is connected to the second terminal of the first N type switch, and the drain electrode of the third NMOS transistor is floating.

17. The static random access memory according to claim 14 wherein the drain electrode of the fourth NMOS transistor is connected to the second terminal of the second N type switch, and the drain electrode of the fourth NMOS transistor is floating.

18. The static random access memory according to claim 10 wherein complementary data are stored in the first storage node and the second storage node.

19. The static random access memory according to claim 9 wherein the hidden refresh unit includes:

an oscillator for generating an oscillation clock signal having a lower frequency than the clock signal; and a flag register connected to the oscillator for receiving the oscillation clock signal, wherein in response to a first voltage level of the oscillation clock, the flag register is set and generates a setting signal to the main control circuit, in response to the setting signal, the main control circuit automatically generates a refresh enabling signal and a corresponding refresh address to the row decoder so as to perform the refresh operation, and the refresh enabling signal is transmitted to the flag register to reset the flag register.

\* \* \* \* \*